(12) United States Patent
Moore et al.

(10) Patent No.: US 9,788,452 B2
(45) Date of Patent: Oct. 10, 2017

(54) MODULAR RACK SYSTEM

(71) Applicant: Hewlett-Packard Development Company, L.P., Houston, TX (US)

(72) Inventors: David A Moore, Tomball, TX (US); John P Franz, Houston, CA (US); Tahir Cader, Liberty Lake, WA (US); Michael L Sabotta, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/690,200

(22) PCT Filed: Oct. 31, 2012

(86) PCT No.: PCT/US2012/062874
§ 371 (c)(1),
(2) Date: Jun. 17, 2015

(87) PCT Pub. No.: WO2014/070176
PCT Pub. Date: May 8, 2014

(65) Prior Publication Data
US 2015/0359131 A1 Dec. 10, 2015

(51) Int. Cl.
*H05K 7/14* (2006.01)
*H05K 7/18* (2006.01)

(52) U.S. Cl.
CPC ............ *H05K 7/1492* (2013.01); *H05K 7/14* (2013.01); *H05K 7/1488* (2013.01); *H05K 7/18* (2013.01)

(58) Field of Classification Search
CPC ............ H05K 7/20781; H05K 7/1488; H05K 7/1492; H05K 7/14; H05K 7/18;
(Continued)

(56) References Cited

U.S. PATENT DOCUMENTS 2,582,553 A * 1/1952 McMurtrie .......... A63H 33/108
211/189
3,279,876 A * 10/1966 St Cyr ................. A47B 57/487
108/107
(Continued)

FOREIGN PATENT DOCUMENTS

CN       2519983 Y    11/2002
CN       1653612       8/2005
(Continued)

OTHER PUBLICATIONS http://www.technet-alliance.com/uploads/tx_caeworld/paper_eurosime32_killat_rudnyi.pdf > On pp. 1-7, Efficient Electrothermal Simulation of Power Electronics for Hybrid Electric Vehicle, Debbi. A. et al., Apr. 20-23, 2008.
(Continued)

*Primary Examiner* — Ko Hung Chan
(74) *Attorney, Agent, or Firm* — Rathe Lindenbaum LLP

(57) ABSTRACT

In one implementation of a modular rack system, a rack module (22, 24, 222, 522, 722, 724) comprises a bay (30, 730) comprising a first side wall (32, 732), a second side wall (32, 732) and floor (36, 736) and an intermediate wall positioning mechanism (280, 380, 390, 392, 790, 792) to support a wall (282, 782) at different spacings with respect to the first side wall (32, 732). In another implementation of the modular rack system, a utility bay (148) extends across rack modules (22, 24, 222, 522, 722, 724).

13 Claims, 11 Drawing Sheets

(58) Field of Classification Search
CPC ...... H01R 13/73; H01R 13/74; H01R 13/741; H01R 13/745; H01R 13/746; H01R 13/748
USPC .......................................................... 211/26
See application file for complete search history.

(56) References Cited

U.S. PATENT DOCUMENTS

| | | | |
|---|---|---|---|
| 3,807,572 A * | 4/1974 | Luvara | A47B 47/042 108/110 |
| 4,453,785 A * | 6/1984 | Smith | G11B 23/0236 206/307.1 |
| 5,417,012 A | 5/1995 | Brightman | |
| 5,505,533 A | 4/1996 | Kammersqard et al. | |
| 5,514,906 A | 5/1996 | Love | |
| 5,829,514 A | 11/1998 | Smith et al. | |
| 5,867,369 A | 2/1999 | Antonuccio et al. | |
| 5,971,166 A * | 10/1999 | Ong | B42F 15/04 211/184 |
| 5,982,616 A | 11/1999 | Moore | |
| 5,986,882 A | 11/1999 | Ekrot et al. | |
| 6,084,769 A | 7/2000 | Moore et al. | |
| 6,111,749 A | 8/2000 | Lamb et al. | |
| 6,234,842 B1 | 5/2001 | Keay et al. | |
| 6,305,180 B1 | 10/2001 | Miller | |
| 6,377,453 B1 | 4/2002 | Belady | |
| 6,600,649 B1 | 7/2003 | Tsai et al. | |
| 7,106,590 B2 | 9/2006 | Chu et al. | |
| 7,133,283 B2 | 11/2006 | Faneuf et al. | |
| 7,298,619 B1 | 11/2007 | Malone et al. | |
| 7,318,322 B2 | 1/2008 | Ota et al. | |
| 7,393,236 B2 | 7/2008 | Thompson et al. | |
| 7,450,378 B2 | 11/2008 | Nelson et al. | |
| 7,539,020 B2 | 5/2009 | Chow et al. | |
| 7,564,685 B2 | 7/2009 | Clidaras et al. | |
| 7,647,787 B2 | 1/2010 | Belady et al. | |
| 7,715,194 B2 | 5/2010 | Brewer et al. | |
| 7,764,494 B2 | 7/2010 | Balzano | |
| 7,800,900 B1 | 9/2010 | Noteboom et al. | |
| 7,907,409 B2 | 3/2011 | Wyatt et al. | |
| 7,916,480 B2 | 3/2011 | Woody et al. | |
| 7,916,483 B2 | 3/2011 | Campbell et al. | |
| 7,971,632 B2 | 7/2011 | Eriksen | |
| 8,004,832 B2 | 8/2011 | Brunschwiler et al. | |
| 8,014,150 B2 | 9/2011 | Campbell et al. | |
| 8,027,162 B2 | 9/2011 | Campbell et al. | |
| 8,050,036 B2 | 11/2011 | Suzuki et al. | |
| 8,079,481 B2 * | 12/2011 | Canfield | H05K 7/183 211/184 |
| 8,844,732 B2 * | 9/2014 | Wu | H05K 13/0069 206/707 |
| 2002/0021557 A1 | 2/2002 | Ishimine et al. | |
| 2004/0069455 A1 | 4/2004 | Lindemuth et al. | |
| 2004/0070949 A1 | 4/2004 | Oikawa et al. | |
| 2004/0201335 A1 | 10/2004 | Davis | |
| 2006/0278372 A1 | 12/2006 | Lai et al. | |
| 2007/0034354 A1 | 2/2007 | Tung et al. | |
| 2007/0119569 A1 | 5/2007 | Campbell et al. | |
| 2007/0163749 A1 | 7/2007 | Miyahara | |
| 2007/0188996 A1 | 8/2007 | Liang | |
| 2007/0289718 A1 | 12/2007 | McCordic et al. | |
| 2007/0291452 A1 | 12/2007 | Gilliland et al. | |
| 2008/0037217 A1 | 2/2008 | Murakami | |
| 2008/0239649 A1 * | 10/2008 | Bradicich | G06F 1/183 361/725 |
| 2008/0271878 A1 | 11/2008 | Harvey et al. | |
| 2009/0052136 A1 | 2/2009 | Chung | |
| 2009/0065178 A1 | 3/2009 | Kasezawa | |
| 2009/0086426 A1 | 4/2009 | Brandon | |
| 2009/0086456 A1 * | 4/2009 | Milo | H05K 7/1409 361/801 |
| 2009/0266515 A1 | 10/2009 | Oikawa | |
| 2010/0032142 A1 | 2/2010 | Copeland et al. | |
| 2010/0051235 A1 | 3/2010 | Mori et al. | |
| 2010/0110621 A1 | 5/2010 | Dunn et al. | |
| 2010/0141379 A1 | 6/2010 | Tucker | |
| 2010/0149754 A1 | 6/2010 | Chapel et al. | |
| 2010/0236772 A1 | 9/2010 | Novotny et al. | |
| 2010/0290190 A1 | 11/2010 | Chester et al. | |
| 2010/0326628 A1 | 12/2010 | Campbell et al. | |
| 2011/0045759 A1 | 2/2011 | Rasmussen et al. | |
| 2011/0056674 A1 | 3/2011 | Campbell et al. | |
| 2011/0060470 A1 | 3/2011 | Campbell et al. | |
| 2011/0073726 A1 | 3/2011 | Bergesch | |
| 2011/0079376 A1 | 4/2011 | Loong et al. | |
| 2011/0242760 A1 | 10/2011 | Bott et al. | |
| 2011/0315367 A1 | 12/2011 | Romero et al. | |
| 2012/0116590 A1 | 5/2012 | Florez-Larrahondo et al. | |
| 2012/0127655 A1 | 5/2012 | Tung | |

FOREIGN PATENT DOCUMENTS

| | | |
|---|---|---|
| CN | 1956101 | 5/2007 |
| CN | 100455175 | 1/2009 |
| CN | 101398706 | 4/2009 |
| CN | 101568248 | 10/2009 |
| CN | 101893921 | 11/2010 |
| CN | 102014508 | 4/2011 |
| CN | 102159051 | 8/2011 |
| CN | 102159058 A | 8/2011 |
| EP | 1860695 | 11/2007 |
| EP | 2490303 | 8/2012 |
| JP | 2300890 | 12/1990 |
| JP | 11220281 | 8/1999 |
| JP | 2000059062 | 2/2000 |
| JP | 2001-168256 | 6/2001 |
| JP | 2010004736 | 1/2010 |
| JP | 2011-108891 | 6/2011 |
| JP | 2000166662 | 6/2012 |
| JP | 200076537 | 3/2014 |
| KR | 100944890 | 3/2010 |
| KR | 20110004857 | 1/2011 |
| KR | 101103394 | 1/2012 |
| TW | M254049 | 12/2004 |
| TW | M312877 | 5/2007 |
| TW | M421677 A | 1/2012 |
| TW | 201249322 A | 12/2012 |
| WO | WO-0242703 | 5/2002 |
| WO | WO-03107523 | 12/2003 |
| WO | WO-2010062553 | 6/2010 |
| WO | WO-2011073668 | 6/2011 |
| WO | WO-2011092333 | 8/2011 |
| WO | WO-2012157247 | 11/2012 |

OTHER PUBLICATIONS

PCT/ISA/KR, International Search Report, dated Nov. 20, 2013, PCT/US2012/062874, 11 pps.
Scofield, Bill.,"Alcatel-lucent Modular Cooling System," 2010, 14 pages.
Unknown., "wiseGeek: What is a Relay Rack?" Retrieved from http://www.wisegeek.com/what-is-a-relay-rack.htm, Aug. 2011, 4 pages.
Moore, et al.; Non-Final Office Action cited in U.S. Appl. No. 14/376,124; dated Jun. 14, 2017; 16 pages.

* cited by examiner

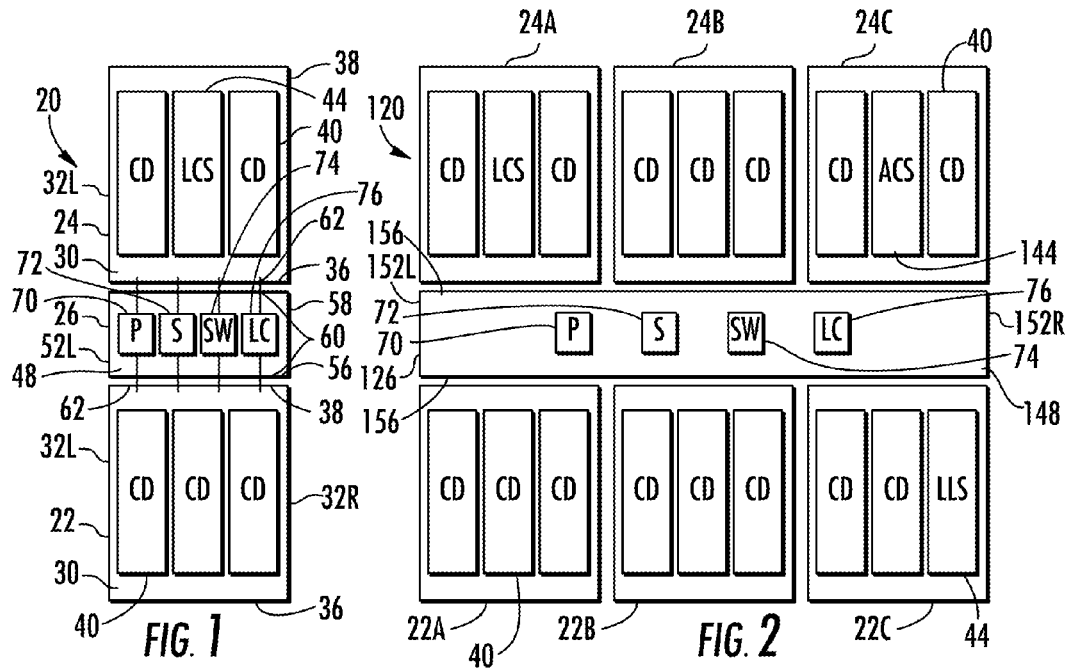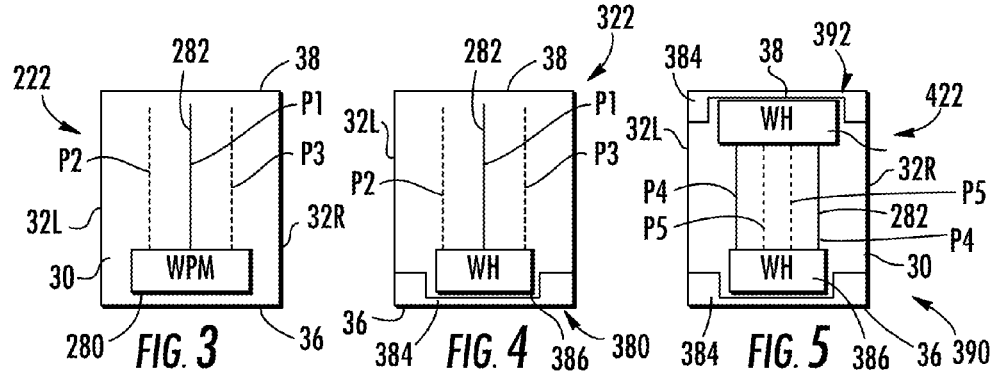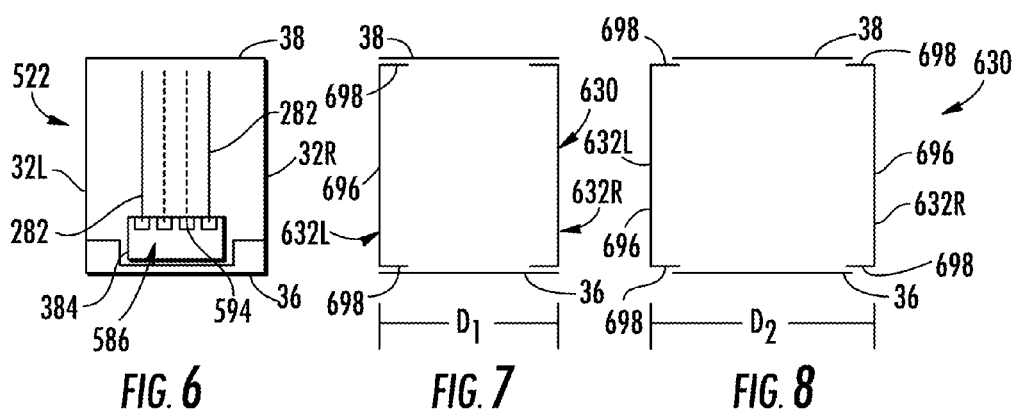

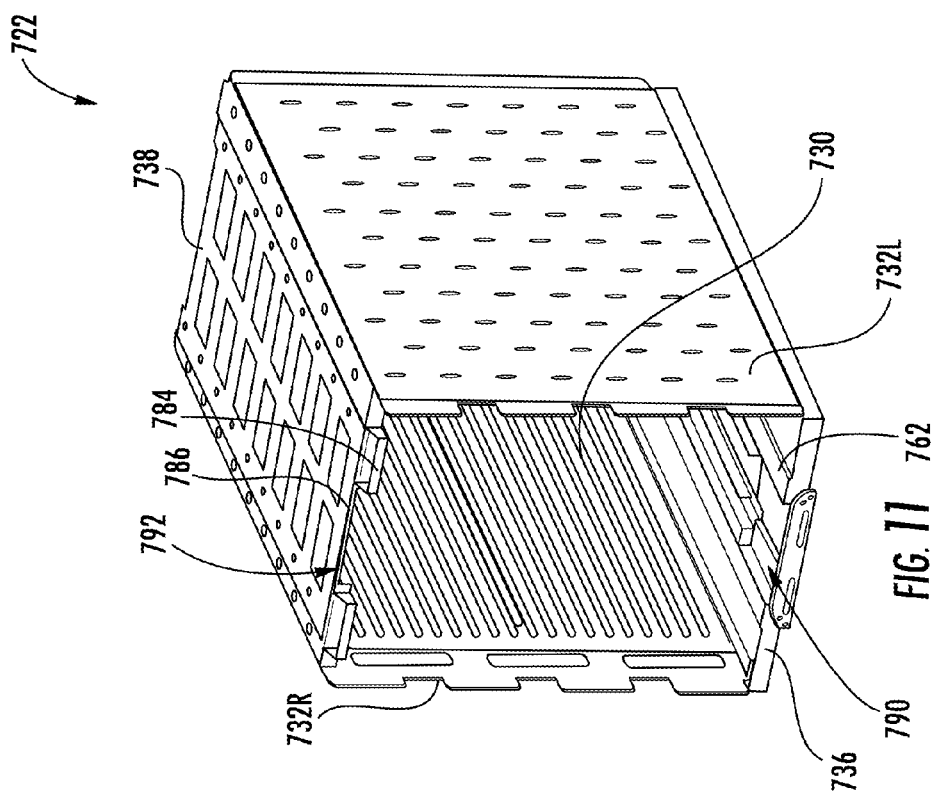
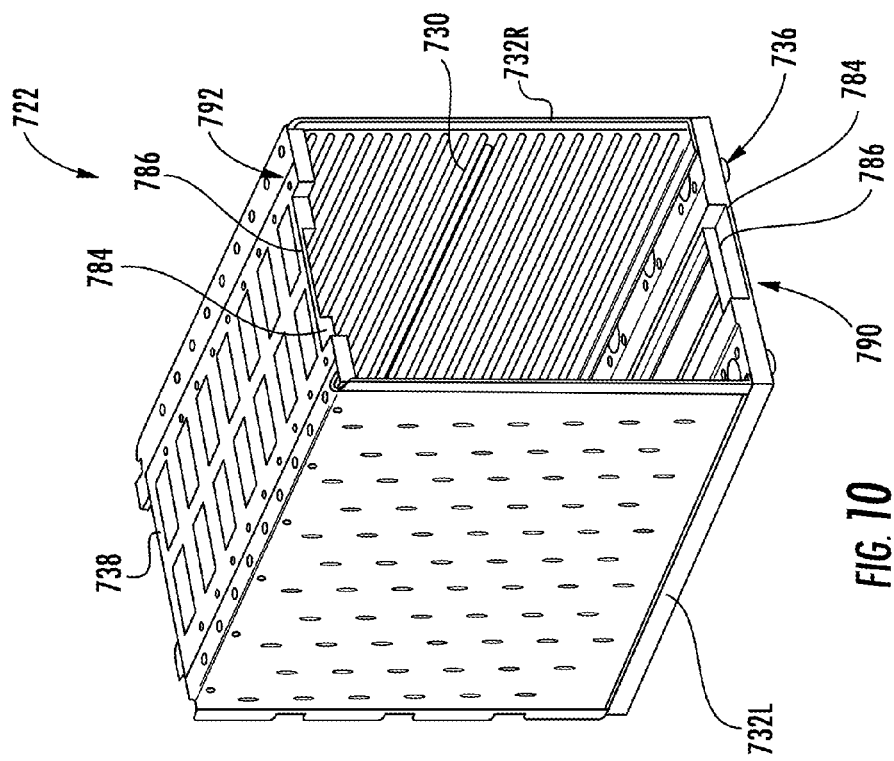

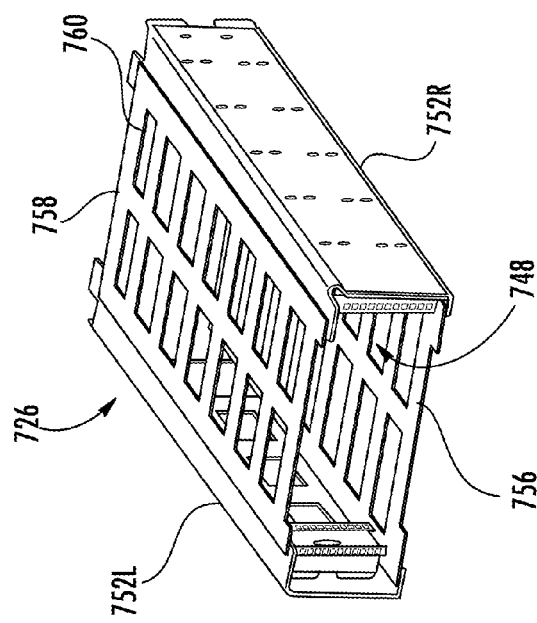
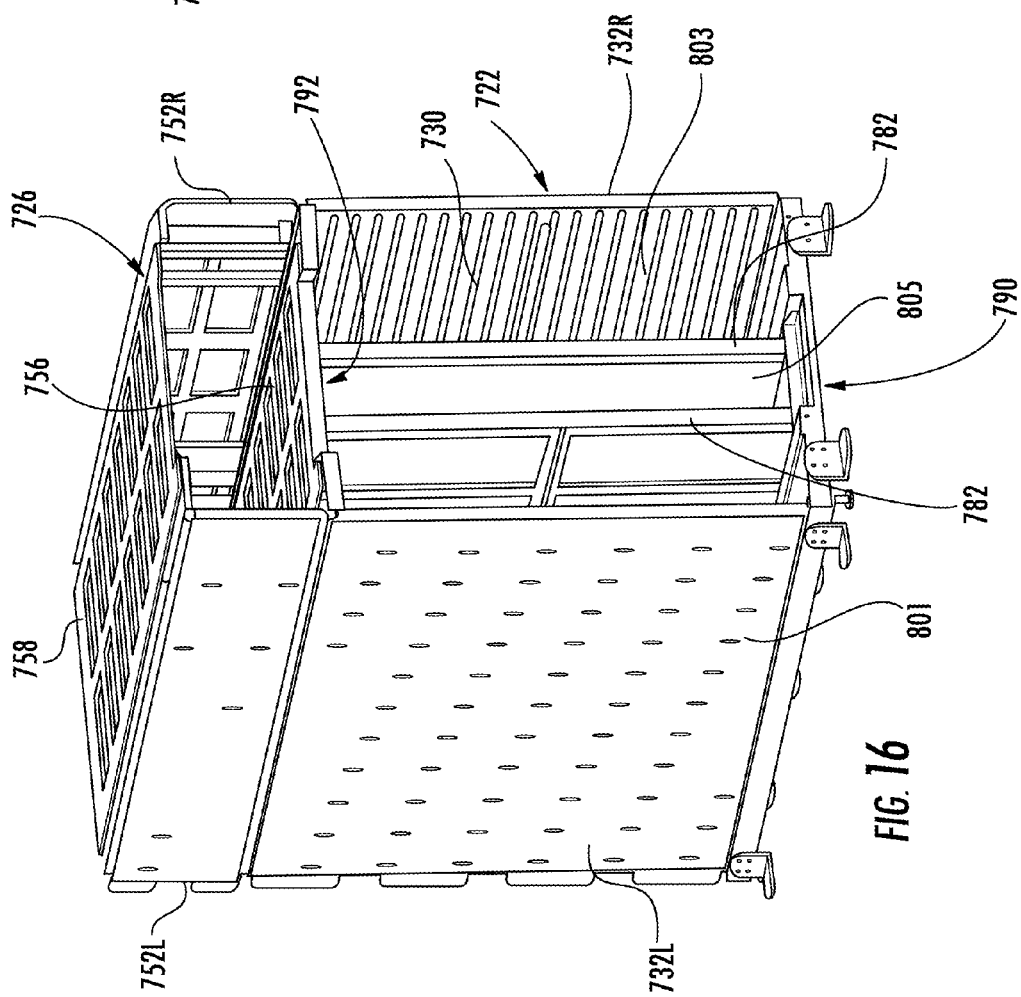

MODULAR RACK SYSTEM

BACKGROUND

Racks are sometimes utilized to support and contain computing devices and associated components. Existing racks are antiquated, lacking flexibility to accommodate different computing device architectures with different cooling, power and data management characteristics.

BRIEF DESCRIPTION OF THE DRAWINGS

FIG. 1 is a schematic illustration of an example modular rack system containing computing devices and associated components.

FIG. 2 is a schematic illustration of an example implementation of the modular rack system of FIG. 1.

FIG. 3 is a schematic illustration of an example implementation of a rack module for the system of FIG. 1 or the system of FIG. 2.

FIG. 4 is a schematic illustration of another example rack module for the system of FIG. 1 or the system of FIG. 2.

FIG. 5 is a schematic illustration of another example rack module for the system of FIG. 1 of the system of FIG. 2.

FIG. 6 is a schematic illustration of another example rack module for the system of FIG. 1 of the system of FIG. 2.

FIG. 7 is a schematic illustration of an example bay, for the systems of FIGS. 1 and 2 or the rack modules of FIG. 3-6, in a narrow state.

FIG. 8 is a schematic illustration of the bay of FIG. 7 in a wide state.

FIG. 10 is a front perspective view of a lower rack module of the system of FIG. 9.

FIG. 11 is a rear perspective view of the lower rack module of the system of FIG. 9.

FIG. 15 is a front perspective view of utility rack module of the system of FIG. 9.

FIG. 16 is a front perspective view of the utility rack module of FIG. 15 coupled to the lower rack module of FIG. 10 containing exemplary walls.

DETAILED DESCRIPTION OF THE EXAMPLE EMBODIMENTS

Figure 9:
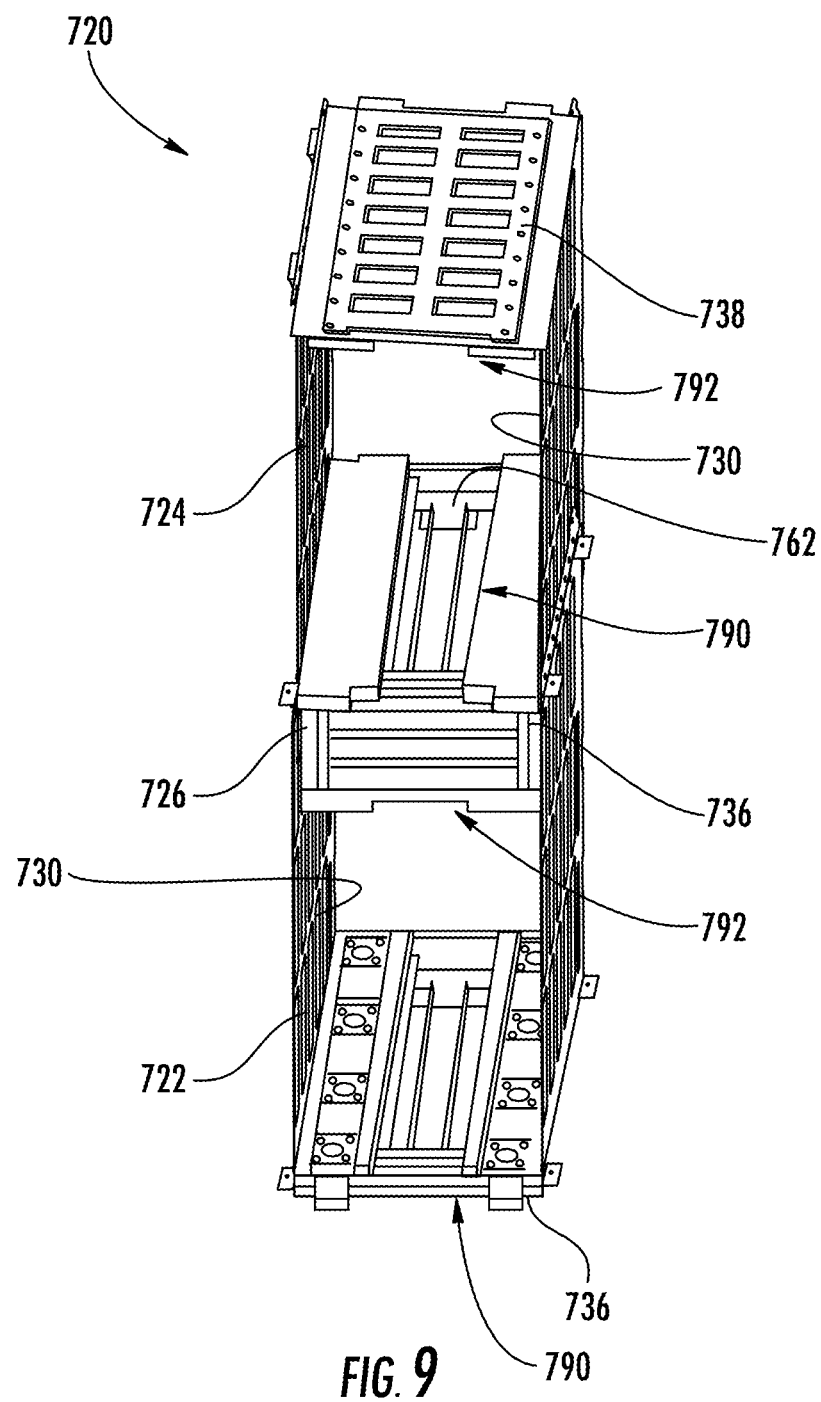
FIG. 9 is a top perspective view of an example implementation of the modular rack system of FIG. 1.

FIG. 1 schematically illustrates an example modular rack system 20 containing various electronic computing devices and associated components. As will be described hereafter, modular rack system 20 comprises a flexible rack system that may accommodate different computing device architectures with different cooling, power and data management characteristics. Modular rack system 20 comprises lower rack module 22, upper rack module 24 and rack utility module 26.

Lower rack module 22 comprises a base unit or module to contain computing devices and associated components while being releasably or removably coupled to rack utility module 26. In other implementations, lower rack module 22 may be directly coupled to upper rack module 24 in the absence of rack utility module 26. For purposes of this disclosure, the term "coupled" shall mean the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature.

Lower rack module 22 comprises a bay 30 formed by or comprising sidewalls 32L, 32R (collectively referred to as side wall 32), floor 36 and top 38. Bay 30 is sized to receive computing devices and associated components. In the example illustrated, bay 30 contains computing devices 40. Computing devices 40 comprise devices having one or more processing units providing computing capabilities. For example, in one implementation, computing devices 40 comprise servers. In other implementations, bay 30 may contain other associated components which are use with computing devices, such as switching components, electronic storage components and the like. In some implementations, bay 30 may additionally or alternatively have voids facilitating air cooling or bay 30 may include cooling mechanisms such as liquid cooling components, heat exchangers, fans and the like. In some implementations, rollers, sleds or the like may be additionally mounted to lower module 22 to facilitate repositioning of system 20.

Upper rack module 24 is releasably or removably coupled directly to utility rack module 26. In other implementations, upper rack module 24 may be directly releasably or removably coupled to lower rack module 22 in the absence of utility rack module 26. Like lower rack module 22, upper rack module 24 comprises a bay 30 formed by or comprising sidewalls 32L, 32R, floor 36 and top 38. In the example illustrated, bay 30 contains computing devices (CD) 40 and liquid cooling system (LCS) 44. Liquid cooling system 44 comprises one or more components which facilitate liquid cooling of computing devices 40. In one implementation, liquid cooling system 44 comprises a heat exchanger. In other implementations, bay 30 may contain other associated components which are used with computing devices, such as switching components, electronic storage components and the like. In some implementations, bay 30 may additionally or alternatively have voids facilitating air cooling or bay 30 may include cooling mechanisms such as liquid cooling components, heat exchangers, fans and the like. In one implementation, upper rack module 24 is identical to lower rack module 22. In other implementations, modules 22 and 24 may be different.

In the example illustrated, floor 36 of upper rack module 24 is identical to floor 36 of lower rack module 22. Likewise, the upwardly facing surface of top 38 of upper rack module 24 is identical to the upwardly facing surface of lower rack module 22. As a result, upper rack module 24 and lower rack module 22 are interchangeable, with or without slight modification, allowing modules 22, 24 to be utilized as interchangeable units, which may be selectively stacked and combined to meet different computing device architectures with different cooling, power and data management characteristics. In other implementations, modules 22 and 24 may not be identical, but may be stacked directly upon one another. Likewise, module 26 may, in some implementations, be stacked upon module 26.

Utility rack module 26 comprises a modular unit serving as an enclosure for computing devices and/or associated components that are shared by computing devices in both lower rack module 22 and upper rack module 24. Utility rack module 26 is coupled between lower rack module 22 and upper rack module 24 and comprises a bay 48 formed by or comprising sidewalls 52L, 52R, floor 56 and top 58. Each of floor 56 and top 58 include openings, notches or cut outs forming passageways 60 through which wiring, cabling, conduits and the like may extend from the interior of utility rack module 26 to the interior of each of modules 22, 24 through openings, passageways or voids 62 in floor 36 and top 38 of modules 24, 22, respectively. Because utility rack module 26 is coupled between module 22, 24 and facilitates the sharing of components by computing devices 40 of both modules 22 and 24, utility rack module 26 further facilitates the building block nature of modules 22, 24 and provides enhanced flexibility when designing such computerized systems.

In the example illustrated, bay 48 contains power component 70, storage component 72, switching device or component 74 and liquid cooling device or component 76. Power component 70 controls and modifies the supply of power to computing devices 40 in each of modules 22, 24. Storage component 72 comprises one or more persistent storage devices, such as flash memory storage devices, disk drive memory storage devices and the like upon which data, code and the like may be written to, stored and/or retrieved from by giving devices 40 in each of modules 22, 24. Switching component 74 comprises a device facilitating load-balancing between computing devices 40 of modules 22 and of module 24 as well as between computing devices 40 of modules 22 and 24. Liquid cooling component 76 comprises a component facilitating liquid cooling within one or both of modules 22, 24. In the example illustrated, liquid cooling component 76 may comprise a liquid manifold connection connecting manifolds that provide liquid cooling conduits for distributing liquid coolant, such as water, through one or both of modules 22, 24. In other implementations, in addition to or as an alternative to simply connecting liquid cooling manifolds of modules 22, 24, liquid cooling component 76 may comprise a manifold for providing liquid cooling to components within module 26 such as power component 70, storage component 72 and switching component 74. Because utility rack module 26 facilitates the sharing of services provided by components 70, 72 and 74 between computing devices 40 of modules 22, 24, utility rack module 26 further enhances the modularity, interchangeability and flexibility of system 20. Although utility rack module 26 is illustrated as having bay 48 containing each of component 70, 72, 74 and 76, in other implementations, bay 48 may contain a fewer of such components or may contain additional or alternative components which provide services that are shared by computing devices 40 in both of modules 22, 24.

FIG. 2 schematically illustrates modular rack system 120, an example implementation of modular rack system 20. Modular rack system 120 is similar to modular rack system 20 except that modular rack system 120 comprises utility rack module 126 in place of utility rack module 26. As with modular rack system 20, modular rack system 120 comprises lower rack module 22 and upper rack module 24. As shown by FIG. 2, modular rack system 120 comprises a plurality of lower rack modules 22A, 22B, 22C (collectively referred to as modules 22) and a plurality of upper rack modules 24A, 24B and 24C (collectively referred to as modules 24). In the example illustrated, some of lower rack module 22 and some of upper rack module 24 contain different architectures and arrangements of computing devices and associated components. For example, modules 22A, 22 Beach contain three computing devices 40. Module 22C includes two computing devices 40 and a side located liquid cooling system 44. Module 24A includes two computing devices 40 and a centrally located liquid cooling system 44. Module 24C comprises two computing devices and a centrally located gas or air cooling system 144. In other implementations, modules 22 and 24 may include other combinations or arrangements of computing devices and associated components.

Utility rack module 126 is similar to utility rack module 26 except that utility rack module 126 comprises a bay 148 formed by or comprising sidewalk 152L, 152R (collectively referred to as side walls 152), floor 156 and top 158. Bay 148 extends across each of modules 22 and modules 24. Bay 148 contains components providing services that are shared by computing devices into or more of modules 22 and 24. In the example illustrated, as with bay 48 of utility rack module 26, bay 148 of utility rack module 126 contains processing component 70, storage component 72, switching and component 74 which provide services that are shared amongst computing devices within modules 22 and 24. Bay 148 may also provide a central connection 76 for liquid cooling. In other implementations, bay 148 may contain a fewer of such components or may contain additional or alternative components which provide services that are shared amongst computing devices 40 in both of modules 22, 24. As with floor 56 and top 58 of utility rack module 26, floor 156 and top 158 of utility rack module 126 comprise openings or passageways 60 described above with respect to module 26. Because utility rack module 126 spans across tops and bottoms of modules 22 and 24, respectively, as a single enclosure a single modular unit, utility rack module 126 further enhances the modular nature of system 120, providing greater flexibility by allowing modules 22 and 24, with their different computing and component architectures to be added, removed or interchanged as desired depending upon changing circumstances or different computing objectives.

FIG. 3 schematically illustrates rack module 222, an example of one implementation of rack module 22 (rack module 22A, 22b, 22C) or of rack module 24 (rack module 24A, 24B, 24C) which may be used in either of systems 20, 120. Rack module 222 further enhances the modularity and flexibility of rack systems 20, 120. Rack module 222 is similar to rack modules 22, 24 except that rack module 222 is specifically illustrated as comprising wall positioning mechanism 280 supporting wall 282. Wall positioning mechanism 280 comprises a mechanism, an arrangement of components, that facilitates the retention and support of wall 282 at one of a plurality of selectable available positions. In the example illustrated, wall positioning mechanism 280 supports or retains wall 282 at a first position P1, which is centrally located between sidewalls 32, dividing or partitioning bay 32 to substantially equal sub chambers. As shown in broken lines, wall positioning mechanism 280 may alternatively support and retain wall 282 at other positions, such as position P2 or position P3. By allowing wall 282 to be supported and retained at different positions within bay 30 in a different spacings with respect to sidewalls 32, wall positioning mechanism 280 allows bay 30 to be modified to accommodate different architectures or layouts for computing devices and associated components.

In one implementation, wall positioning mechanism 280 comprises a mechanism which allows wall 282 to be transversely slid (to the left or to the right as seen in FIG. 3) while remaining connected to wall positioning mechanism 280. In another implementation, wall positioning mechanism 280 is removable from bay 30, allowing wall positioning mechanism 280 to be exchanged with the different wall positioning mechanism 280 which supports wall 282 at a different position with respect to sidewalk 32. In one implementation, wall positioning mechanism 280 may have a plurality of transversely spaced connectors, wherein wall 32 may be selectively connected to a selected one of the plurality of transversely spaced connectors to position wall 282 at a desired position with respect to sidewalk 32. In one implementation, such transversely spaced connectors may comprise tracks or grooves into which wall 282 slides until retained.

Wall 282 comprises a structure extending at least partially across bay 30 substantially perpendicular to floor 36 and top 38. Wall 282 partitions bay 30 into multiple sub chambers or sub compartments which receive computing devices 40 and/or associated components, such as liquid cooling system 44, air cooling system 144 and the like. In one implementation, wall 282 carries additional components or is otherwise configured so as to serve one or both of computing devices or other associated components contained within the adjacent sub compartments. In one implementation, wall 282 may comprise a liquid wall or liquid manifold supporting passages or conduits through which water or other liquid flows to facilitate liquid cooling of the adjacent sub compartments. In one implementation, one of the adjacent cards may include a heat exchanger, wherein wall 282 supplies cooling liquid tubes that withdraw heat from an adjacent computing device 40, wherein the heat exchanger withdraws heat from the liquid carried along wall 282.

In one implementation, wall 282 is removably connectable to wall positioning mechanism 280, allowing different walls to be selectively attached to wall positioning mechanism 280 depending upon the architecture and arrangement of computing devices and associated components. In other implementations, wall 282 may be permanently connected to wall positioning mechanism 280 so as to not be separable from wall positioning mechanism 280 without damage to wall positioning mechanism 280 or without damage to wall 282. In such an implementation, wall 282 may be provided at other locations by being moved with respect to wall positioning mechanism 280 while remaining connected to wall positioning mechanism 280 or by being carried with wall positioning mechanism 280 as wall positioning mechanism 280 is replaced with another wall positioning mechanism 280 supporting the same wall 32 at a different position.

FIG. 4 schematically illustrates rack module 322, an example implementation of rack module 222. Rack module 322 may be utilized in either of systems 20, 120 described above, may be used with other systems, or may be used independent of such systems. Rack module 322 is similar to rack module 222 except that rack module 322 comprises wall positioning mechanism 380, an implementation of wall positioning mechanism 280. Wall positioning mechanism 380 comprises wall holder mounting mechanism 384 and wall holder 386. Wall holder mounting mechanism 384 comprises a mechanism configured to releasably or removably secure and retain wall holder 386 with respect to bay 30. In the example illustrated, wall holder mounting mechanism 384 comprises an elongate cavity or channel into which wall holder 386 may be vertically dropped or horizontally slid. Once within the elongate cavity or channel, wall holder mounting mechanism 384 releasably retains wall holder 386 in place through screws, clips, resiliently biased hooks, latches, pins or the like.

Wall holder 386 comprises a member which acts as a carriage, base, stand or the like configured to support wall 282 such that wall 282 projects in a direction from floor 36 towards top 38. In one implementation, wall holder 386 is firmly fixed to wall 282, wherein system 322 may comprise a plurality of different wall holders 36, each different wall holder 386 supporting wall 32 at a different position, wherein different wall holders 386 having walls 282 at different positions may be interchanged to provide wall 282 at different positions, such as P1, P2 and P3. In other implementations, wall holder 386 may be configured to allow wall 282 to be slid to different positions while being retained by wall holder 386. In yet other implementations, wall holder 386 may include wall connectors, such as tracks or grooves that slidably receive and retain wall 282 at a selected one of a plurality of different available positions with respect to wall holder 386.

FIG. 3 schematically illustrates rack module 422, another example implementation of rack module 222 and rack module 322. As with rack modules 222 and 322, rack module 422 may be employed in rack systems 20, 120 or may be employed with other systems or independent of any modular systems. Rack module 422 is similar to rack module 322 except that rack module 422 additionally comprises wall positioning mechanisms 390 and 392. Wall positioning mechanisms 390 and 392 assist in supporting multiple walls 282 at different positions with respect to sidewall 32. In the example illustrated, each of wall positioning mechanisms 390 and 392 is similar to wall positioning mechanism 380. Wall positioning mechanism 390 extends proximate to floor 36 while wall positioning mechanism 392 extends proximate to top 38. In the example illustrated, each of wall positioning mechanisms 390, 392 comprise wall holder mounting mechanism 384 and wall holder 386. Wall holders 386 support and retain opposite ends of walls 282 for enhanced stability. Wall holders 386 enable each of walls 282 to be supported at different positions relative to one another and relative to sidewalls 32. As a result, wall holder 386 and wall holder mounting mechanism 384 provide rack module 422 with enhanced flexibility so as to accommodate different computing devices and different associate components within bay 30. For example, in one implementation, walls 282 may be positioned at positions P4 to partition bay 30 into three equally sized sub compartments for receiving three computing devices. Alternatively, walls 282 may be positioned at positions P5 to partition bay 30 into two larger outer side sub compartments and a narrower intermediate sub compartment, wherein the outer side sub compartments may receive larger computing devices and wherein a liquid cooling system 44 (described above) may be positioned within the intermediate narrower sub compartment. In yet other implementations, walls 282 may be positioned and retained by wall holders 386 at other positions.

FIG. 6 schematically illustrates rack module 522, an example implementation of rack module 322. Rack module 522 is similar to rack module 322 except that rack module 522 comprises wall holder 586 in place of wall holder 386.

Wall holder 586 is similar to wall holder 386 except that wall holder 586 is illustrated as specifically comprising wall connectors 594. Wall connectors 594 facilitate releasable and removable connection of walls 282 each at a selectable position with respect to sidewalls 32. In the example illustrated, each of wall connectors 594 comprises a track or groove into which walls 282 may be vertically dropped or horizontally slid and retained.

In other implementations, wall connectors 594 may comprise other connection mechanisms allowing walls 282 to be connected to and disconnected from wall holder 586 at various selected positions along wall holder 586. For example, wall holder 586 may include a plurality of spaced projections, such as pins or tongues that are received by corresponding detents along an edge of walls 282. Although rack module 522 is illustrated as including wall holder mounting mechanism 384 and wall holder 586 just along the bottom 36, in other implementations, wall holder mounting mechanism 384 and wall holder 586 may additionally be provided proximate to top 38 for retaining opposite edges of walls 282 at selected positions similar to as described above with respect to rack module 422 in FIG. 5.

FIGS. 7 and 8 schematically illustrate bay 630, an example implementation of bay 30. In particular implementations, each of bays 30 described above may constitute bay 630 shown in FIGS. 7 and 8. Bay 630 is similar to bay 30 except that bay 630 comprises side walls 632L and 632R (collectively referred to as side walls 632) in place of sidewalls 32. Each of sidewalls 632 comprises a vertical panel 696 and flanges 698. Vertical panels 696 of sidewalls 632 form the sides of bay 30. In some implementations, panels 696 may support rails or shelves for supporting computing devices or components.

Flanges 698 horizontally or obliquely extend from vertical panels 696. Flanges 698 of sidewall 632L project or extend towards sidewall 632R while flanges 696 of sidewall 632 project or extend towards sidewall 632L. Flanges 698 overlap floor 36 and top 38 and are configured to be releasably secured in place (by pins, screws, fasteners, snaps, latches, hooks and the like) relative to floor 36 and top 38 at a selected one of a plurality of positions. As a result, the spacing between sidewalls 632 may be adjusted to accommodate different architectures or layouts of computing devices and associated component. Moreover, the outer transverse dimensions of bay 630 may be adjusted to accommodate different tile or floor spacings.

In one implementation, sidewalls 632 are adjustable from a first position shown in FIG. 7 wherein vertical panels 696 are spaced by a distance D1 to a second position shown in FIG. 8 wherein vertical panels 696 are spaced by a distance D2. In one implementation, distance D1 is 600 mm, a US tile spacing distance, while distance D2 is 609 mm, a European the spacing distance. As a result, a rack module utilizing bay 630 may be easily adapted to the different tile spacings of US and European architectures.

FIG. 9 illustrates modular rack system 720, an example implementation of modular rack system 20. Like modular rack system 20, modular rack system 720 comprises a flexible rack system that may accommodate different computing device architectures with different cooling, power and data management characteristics. Modular rack system 720 comprises lower rack module 722, upper rack module 24 and rack utility module 726.

Figure 12:
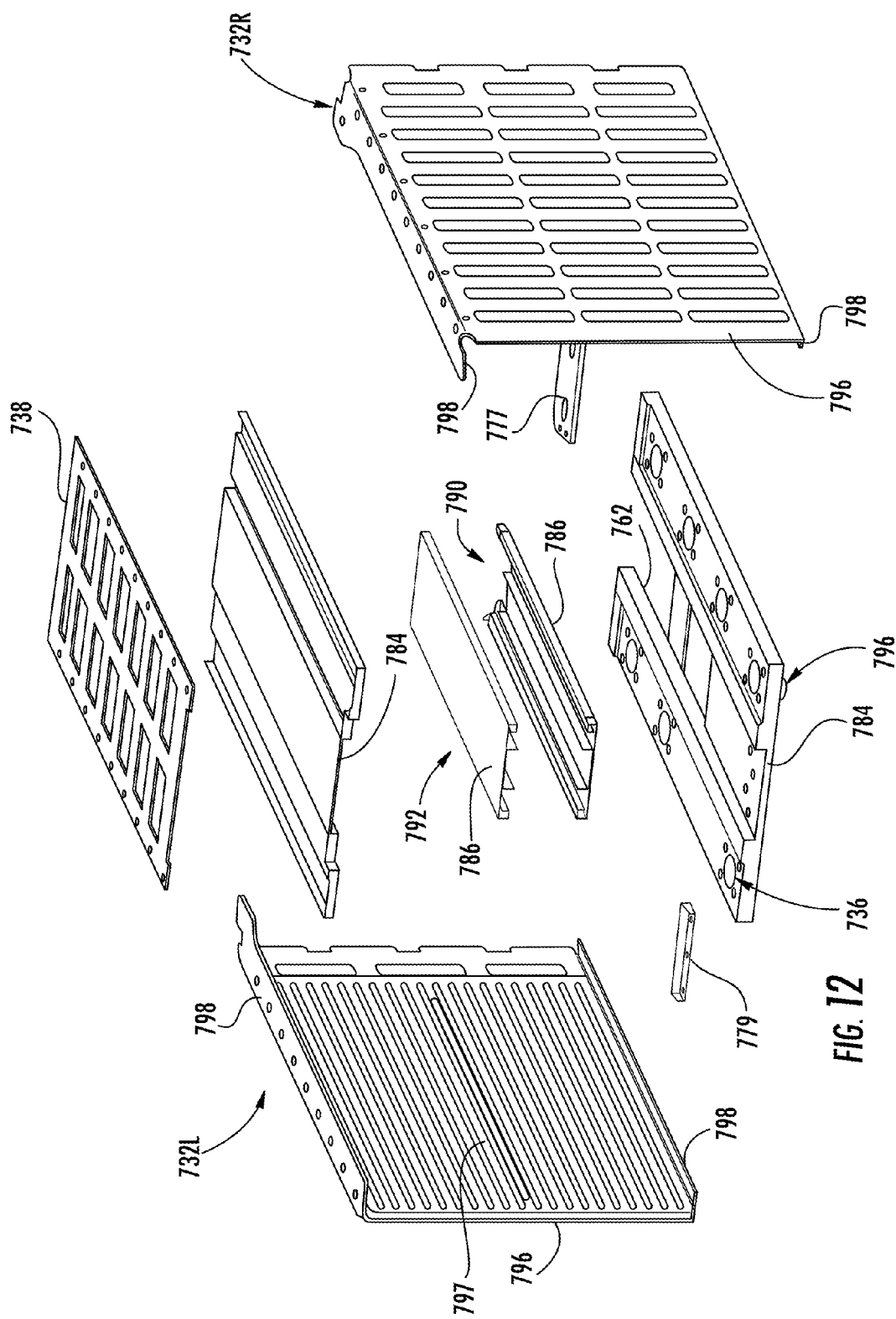
FIG. 12 is an exploded perspective view of the lower rack module of FIG. 10.

FIGS. 10-12 illustrate lower rack module 722 in more detail. Lower rack module 722 comprises a base unit or module to contain computing devices and associated components while being releasably or removably coupled to rack utility module 726. In other implementations, lower rack module 722 may be directly coupled to upper rack module 724 in the absence of rack utility module 726. Lower rack module 722 comprises bay 730, wall positioning mechanism 790 and wall positioning mechanism 792.

Figure 13:
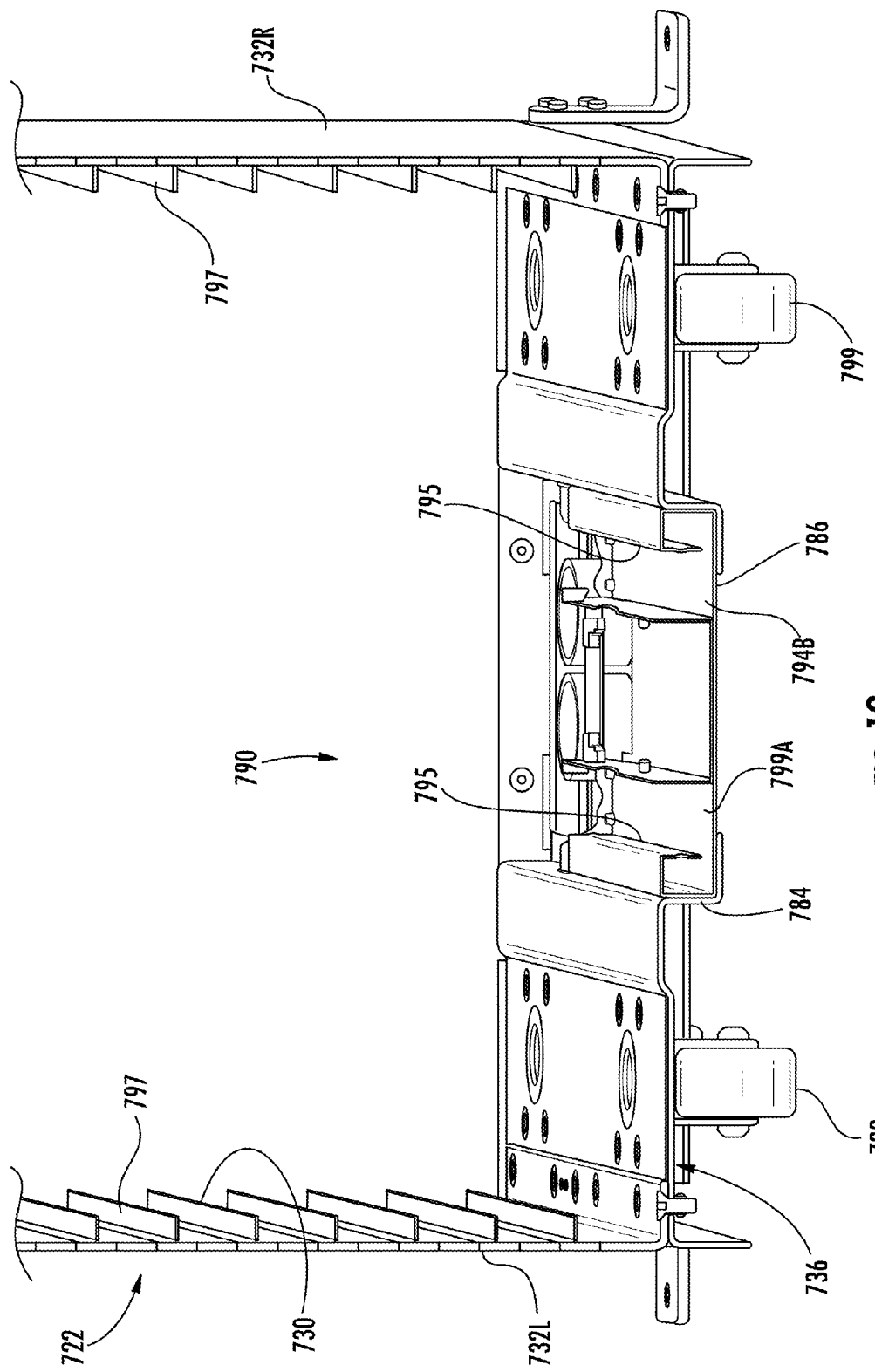
FIG. 13 is an enlarged fragmentary perspective view of a portion of the lower rack module of FIG. 9.

Bay 730 is formed by or comprises sidewalls 732L, 732R (collectively referred to as side walls 732), base or floor 736, and top 738. Bay 730 is sized to receive computing devices 40 (shown and described above) and associated components. As shown by FIG. 12, sidewalls 732 are similar to sidewalls 632 of bay 630 described above with respect to FIGS. 7 and 8. Each of sidewalls 732 comprises a vertical panel 796 and flanges 798. Vertical panels 796 of sidewalls 732 form the sides of bay 730. As shown by FIGS. 12 and 13, vertical panels 796 further mount and support shelves or rails 797 for supporting computing devices. In other implementations, rails 797 may be omitted.

Flanges 798 horizontally or obliquely extend from vertical panels 796. Flanges 798 of sidewall 732L project or extend towards sidewall 732R while flanges 798 of sidewall 732R project or extend towards sidewall 732L. Flanges 798 overlap floor 736 and top 738 and are configured to be releasably secured in place (by pins, screws, fasteners, snaps, latches, hooks and the like) relative to floor 736 and top 738 at a selected one of a plurality of positions. As a result, the spacing between sidewalls 732 may be adjusted to accommodate different architectures or layouts of computing devices and associated component. Moreover, the outer transverse dimensions of bay 730 may be adjusted to accommodate different tile or floor spacings. In one implementation, sidewalls 732 are adjustable from a first position wherein vertical panels 796 are spaced by a distance of 600 mm, a US tile spacing distance, to a second position wherein vertical panels 796 are spaced by a distance of 609 mm, a European tile spacing distance. As a result, modular rack system 720 utilizing bay 730 may be easily adapted to the different tile spacings of US and European architectures.

Floor 736 comprises one or more structures forming the bottom of bay 730. Floor 736 extends below lower flanges 798 of sidewalls 732. As will be described hereafter, floor 736 forms or provides part of wall holder mounting mechanism 790. Top 738 comprises a panel extending opposite the floor 736 and coupled to upper flanges 798 of sidewall 732. In other implementations, floor 736 and top 738 may have other configurations. For example, floor 736 may be independent of wall positioning mechanism 790.

Wall positioning mechanisms 790 and 792 assist in supporting multiple walls 782 (shown in FIG. 16) at different positions with respect to sidewalls 732. Wall positioning mechanisms 790 and 792 assist in supporting multiple walls 282 at different positions with respect to sidewall 732. Wall positioning mechanism 790 extends proximate to floor 736 while wall positioning mechanism 792 extends proximate to top 738. In the example illustrated, each of wall positioning mechanisms 790, 792 comprise wall holder mounting mechanism 784 and wall holder 786. Wall holders 786 support and retain opposite ends of walls 782 for enhanced stability. Wall holders 786 enable each of walls 782 to be supported at different positions relative to one another and relative to sidewalls 732. As a result, wall holder 786 and wall holder mounting mechanism 784 provide rack module 722 with enhanced flexibility so as to accommodate different computing devices and different associate components within bay 730.

Figure 14:
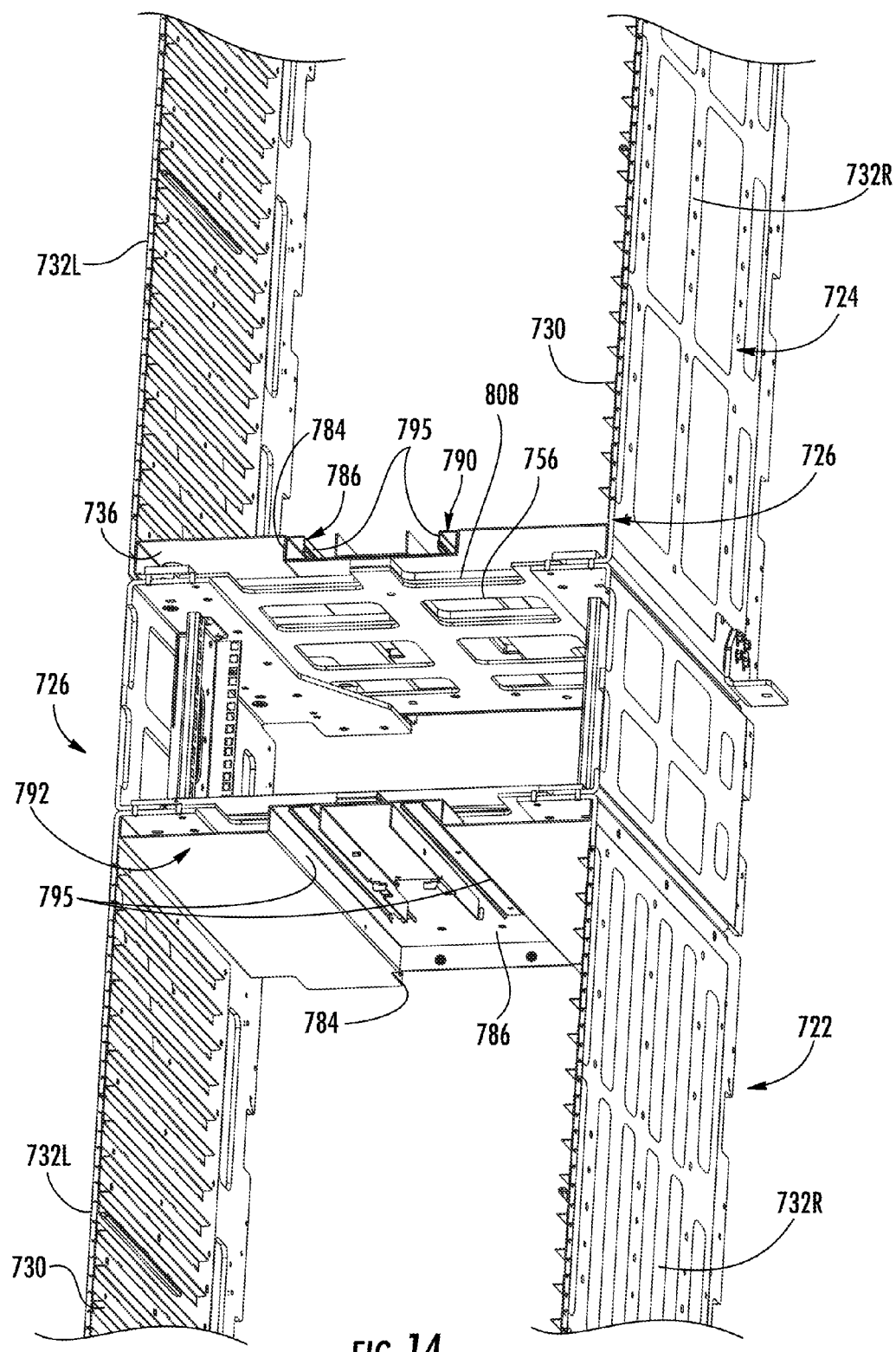
FIG. 14 is a bottom perspective view of a portion of the system of FIG. 9.

As shown by FIGS. 13 and 14, wall holder mounting mechanism 784 comprises a mechanism configured to releasably or removably secure and retain wall holder 786 with respect to bay 730. In the example illustrated, wall holder mounting mechanism 784 comprises an elongate cavity or channel into which wall holder 786 may be vertically dropped or horizontally slid. Once within the elongate cavity or channel, wall holder mounting mechanism 784 releasably retains wall holder 786 in place through screws, clips, resiliently biased books, latches, pins or the like. In some implementations, the elongate cavity or channel may include keying features, permitting only certain kinds of or types of walls to be received within such channels. For example, in one implementation, wall holder mounting mechanism 784 may include keying feature which merely allows water circulating walls to be received. A different wall holder mounting mechanism 784 may include a different keying feature which merely allows a solid wall to be received and supported.

Wall holder 786 comprises a member which acts as a carriage, base, stand or the like configured to support wall 782 (shown in FIG. 16) such that wall 782 projects in a direction from floor 736 towards top 738. In the example illustrated, wall holder 786 comprises wall connectors 794A and 794B (collectively referred to as wall connectors 794). Wall connectors 794 facilitate releasable and removable connection of walls 782 each at a selectable position with respect to sidewalk 732. In the example illustrated, each of wall connectors 794 comprises a track or groove 795 into which walls 282 may be vertically dropped or horizontally slid and retained.

In operation, to provide walls 782 at different positions and different spacings with respect to sidewalk 732, holder 786 of each of wall positioning mechanism 790, 792 (shown in FIG. 13) may be removed from the corresponding channel of wall holder mounting mechanism 784 and replaced with a different holder 786 having tracks 795 having different spacings with respect to one another and with respect to sidewalk 732. As a result, the walls 782 positioned within tracks 795 of the wall holder 786 are supported at different spacings with respect to sidewalk 732. In other implementations, in lieu of utilizing tracks 795, holder 786 may utilize other connection mechanisms for releasably connecting and retaining walls 782. Although wall holder 786 is illustrated as having tracks 795 that removably receive walls 782 which allow walls 782 to be exchanged for repair or replacement, in other implementations, walls 782 may alternatively be permanently fixed to holder 786.

As shown by FIG. 12, in some implementations, floor 736 may be additionally provided with a rear brace 777 and a dam 779. Rear brace 777 provides stiffening support while dam 779 serves as a fluid retention dam when used in conjunction with a water cooled system. In some implementations, such additional components may be omitted. As further shown by FIG. 13, in some implementations, rollers, sleds or the like may be additionally mounted to lower module 722 to facilitate repositioning of system 720. In the example illustrated, rollers 799 are mounted to an underside of floor 736. In other implementations, rollers 799 may be omitted or other mechanism may be provided to facilitate positioning of system 720.

FIG. 15 is a perspective view illustrating utility rack module 726. Utility rack module 726 comprises a modular unit serving as an enclosure for computing devices and/or associated components that are shared by computing devices in both lower rack module 722 and upper rack module 724. Utility rack module 726 is coupled between lower rack module 722 and upper rack module 724 and comprises a bay 748 formed by or comprising sidewalls 752L, 752R, floor 756 and top 758. Each of floor 756 and top 758 include openings, notches or cut outs forming passageways 760 through which wiring, cabling, conduits and the like may extend from the interior of utility rack module 26 to the interior of each of modules 22, 24 through openings, passageways or voids 762 in floor 736 and top 738 of modules 724, 722, respectively. Because utility rack module 726 is coupled between module 722, 724 and facilitates the sharing of components by computing devices 40 of both modules 722 and 724, utility rack module 726 further facilitates the building block nature of modules 722, 724 and provides enhanced flexibility when designing such computerized systems.

As discussed above with respect to utility rack modules 26, 126, bay 748 contains power component 70, storage component 72, switching device or component 74 and liquid cooling device or component 76 (shown and described above with respect to FIGS. 1 and 2). Because utility rack module 726 facilitates the sharing of services provided by components 70, 72, 74 and 76 between computing devices 40 of modules 722, 724, utility rack module 726 further enhances the modularity, interchangeability and flexibility of system 720.

FIG. 16 illustrates utility rack module 726 releasably mounted to lower module 722. In one implementation, lower module 722 and utility rack module 726 may be secured to one another and shipped as a single unit. Even when such modules are combined, lower module 722 and utility rack module 726 have a height much less than current full height racks, facilitating shipping. FIG. 16 further illustrates one example implementation where an walls 782 are supported retained by wall positioning mechanisms 790, 792. In one implementation, walls 782 comprise liquid channeling walls that channel a liquid, such as water, to draw heat from adjacent computing devices in outer chambers 801, 803. In such an implementation, walls 782 extend on opposite sides of a chamber 805 that receives a heat exchanger.

Figure 17:
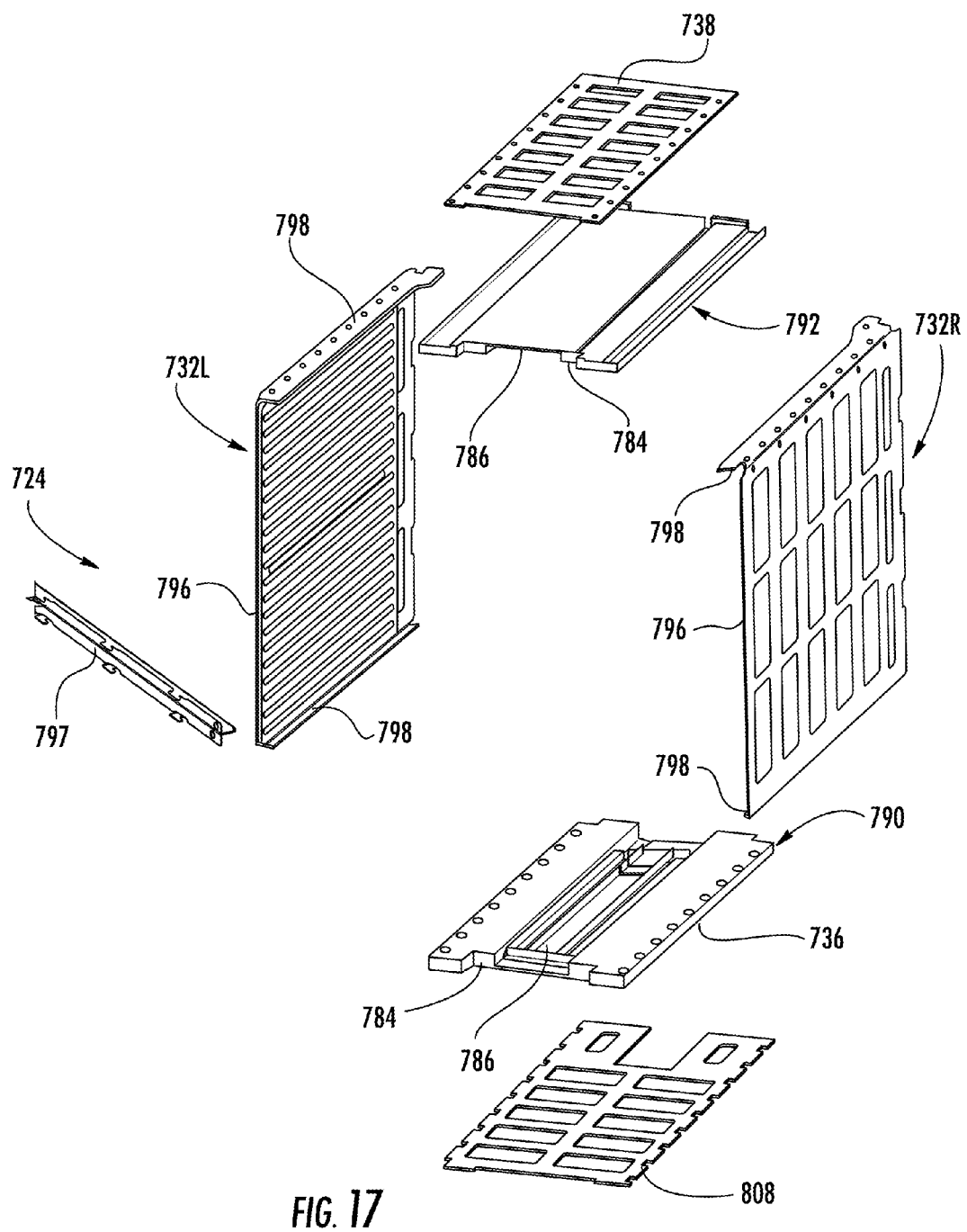
FIG. 17 is an exploded perspective view of an upper rack module of the system of FIG. 9.

FIG. 17 is an exploded perspective view of upper rack module 724. Upper rack module 724 is substantially identical to lower rack module 22 but for base 808. Those remaining elements of upper rack module 724 which correspond to elements or components of lower rack module 722 are numbered similarly. Base 808 comprises a perforate panel extending between sidewalls 732 which underlies floor 736 to support floor 736. In other implementations, base 808 may be omitted.

Figure 18:
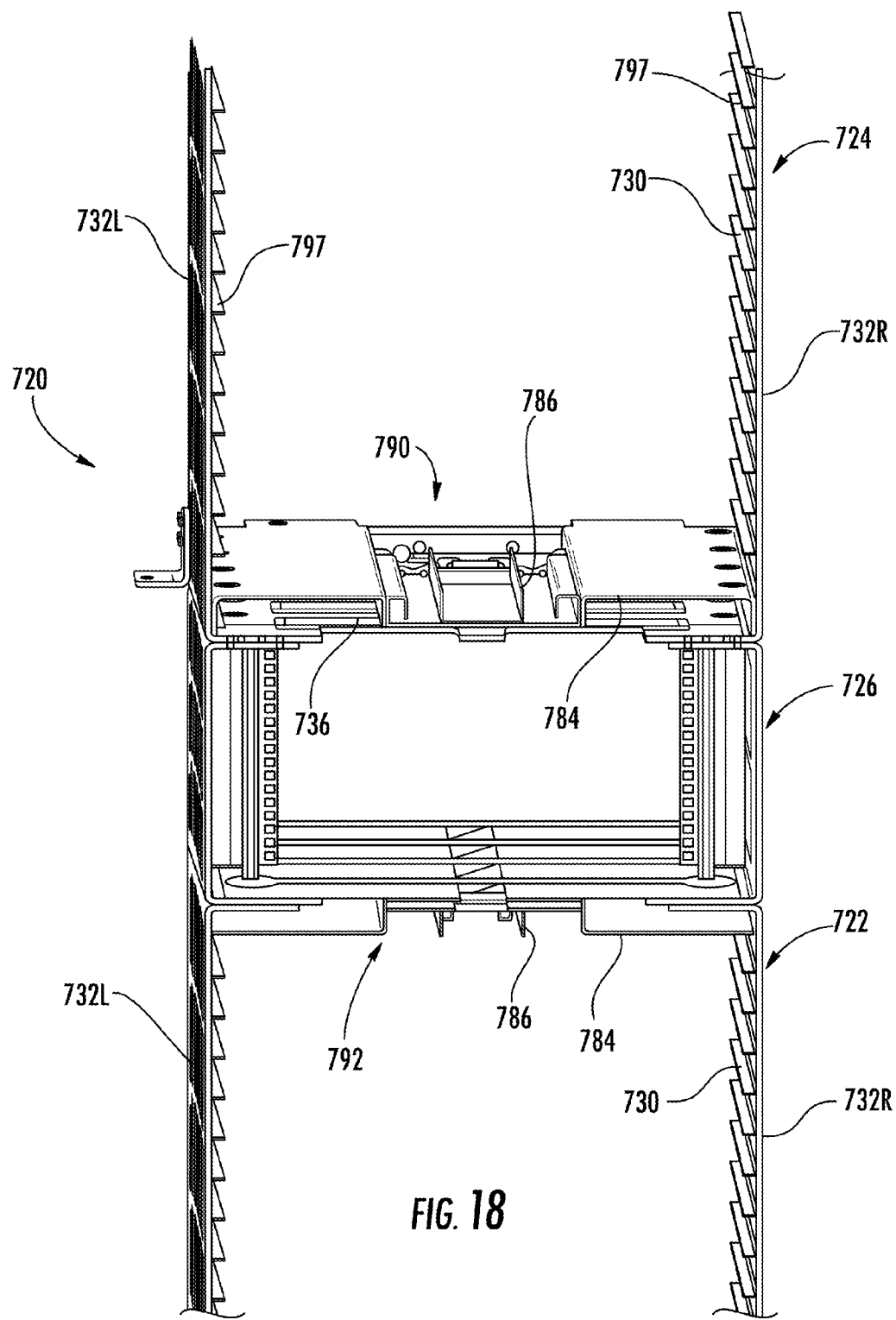
FIG. 18 is a fragmentary top perspective view of the system of FIG. 9.

FIG. 18 is a fragmentary sectional view illustrating upper rack module 724 in more detail. As shown by FIG. 18, upper rack module 724 is substantially identical to lower rack module 722. As a result, upper rack module 724 and lower rack module 722 may be interchanged and stacked to accommodate different computing and associated component arrangements.

Figure 19:
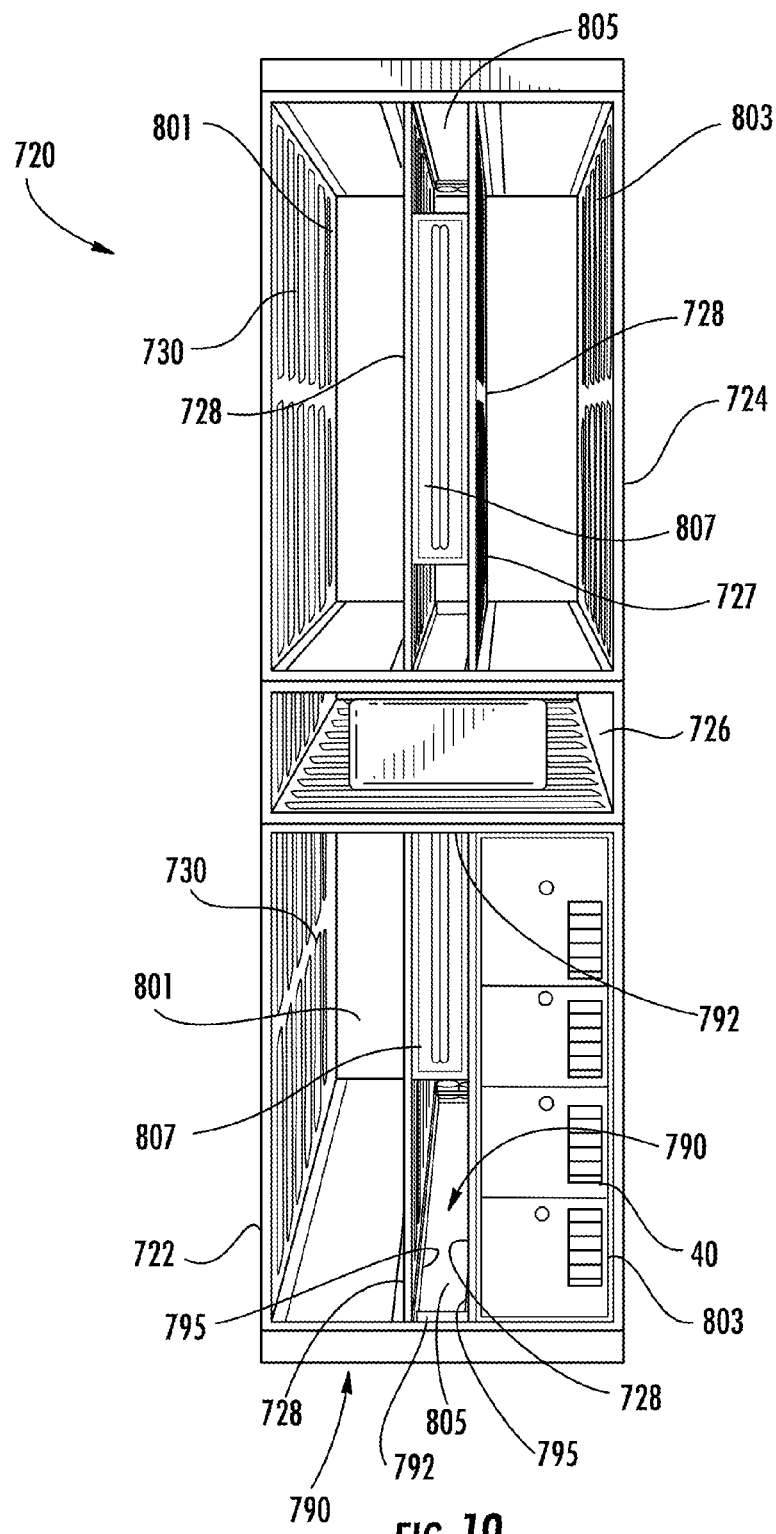
FIG. 19 is a front perspective view of the modular rack system of FIG. 9 containing computing devices and associated components.

FIG. 19 illustrates modular rack system 720 containing computing devices and associated components. In the arrangement shown in FIG. 19, lower rack module 722 includes walls 728 releasably mounted within channels 795 of wall positioning mechanisms 790, 792. Walls 728 comprise liquid cooling manifolds, including fluid conduits circulating liquid, such as water, to draw heat from adjacent compartments or chambers. Walls 728 are supported and retained by will positioning mechanisms 790, 792 so as to partition bay 730 into two outer side chambers 801, 803 and an intermediate chamber 805. In the example illustrated, chamber 803 contains multiple computing devices 40 supported by rails 797 (shown in FIG. 12). Chamber 805 includes a heat exchanger 807 which draws heat from the circulating liquid within walls 728. Utility rack module 726 contains switches, pool power connections and batteries, boot drives and the like, the resources of which are shared by computing devices in both lower rack module 722 an upper rack module 724. In the example illustrated, bay 730 of upper rack module 724 is partitioned by walls 728 in a fashion similar to lower rack module 722, forming outer side compartments 801, 803 and center compartment 805. Center compartment 805 of upper module 724, like center compartment 805 of lower module 722, contains a heat exchanger 807 for extracting heat from walls 728. Walls 728 extract heat from computing devices (not shown) contained within side compartments 801 and 803. FIG. 19 illustrates but one example of a rack infrastructure architectures with portions empty for purposes of illustration.

Figure 20:
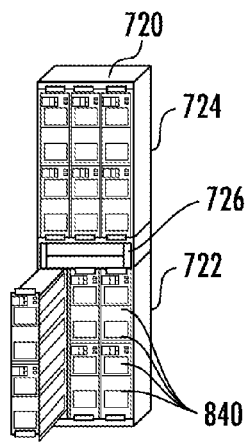
FIGS. 20-23 are perspective views illustrating the modular rack system of FIG. 9 in various configurations.
Figure 21:
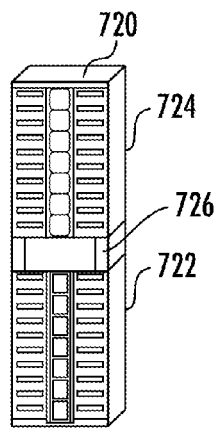
Figure 22:
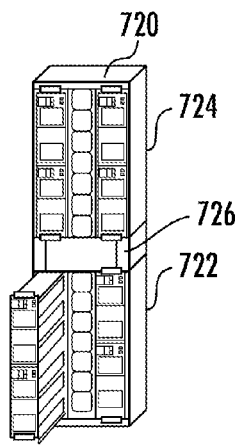
Figure 23:
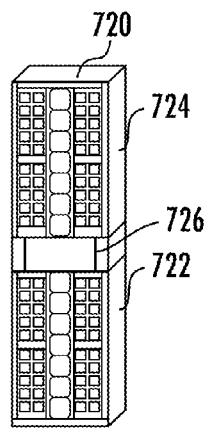

FIGS. 21-23 illustrate modular rack system 720 utilized in various rack infrastructure configurations through mixing and matching of module types. FIG. 20 illustrates modular rack system 720 utilized in a storage solution in which upper and lower modules 722, 724 contain multiple servers 840, wherein each server 840 includes multiple disk drives. FIG. 21 illustrate modular rack system 720 implement it as part of a cloud solution, wherein upper and lower modules 722, 724 contain socket servers. FIG. 22 illustrates modular rack system 720 utilized in another cloud solution in which upper and lower modules 722 and 724 contain lower power or reduced processing capability nodes. FIG. 23 illustrates modular rack system 720 utilizes part of a high-performance computing (HPC) distributed computing server, wherein upper and lower modules 722 and 724 contain multiple nodes.

Figure 24:
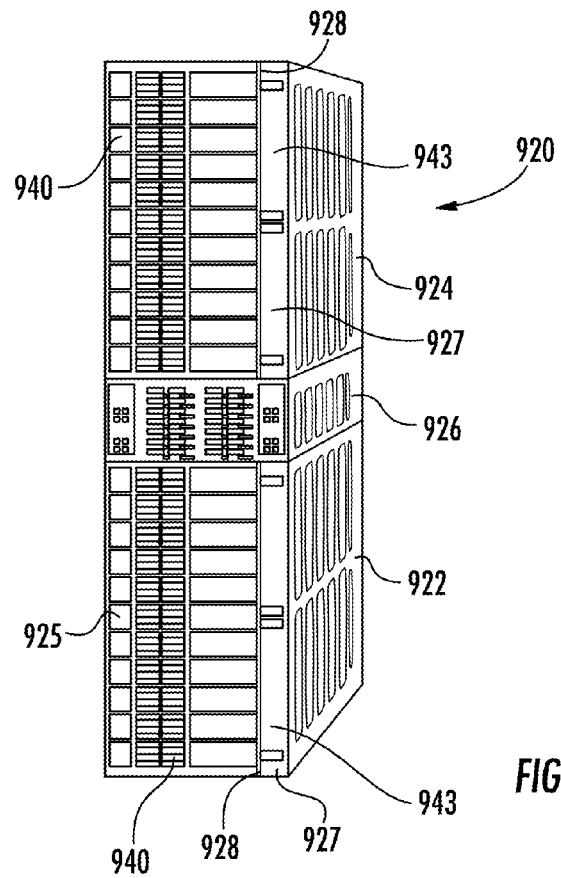
FIG. 24 is a perspective view of another example implementation of the modular rack system of FIG. 1.

FIG. 24 illustrates modular rack system 920, an example implementation of modular rack system 20. Modular rack system 920 comprises lower rack module 922, upper rack module 924 and utility rack module 926. Lower rack module 922 and upper rack module 924 are substantially identical to one another and are stacked about utility rack module 926. Each of lower rack module 922 and upper rack module 924 includes a main compartment 925 in which computing devices 940 are stacked and a side compartment 927 in which the liquid manifold wall 928 extends adjacent to the stack of computing device 940 and in which a heat exchanger 943 is contained to extract heat from the liquid manifold wall 928. Utility rack module 926 provides shared resources for computing device 940 contained within modules 922 and 924. Such shared resource may comprise power, switches, storage and liquid cooling conduit connections.

Although the present disclosure has been described with reference to example embodiments, workers skilled in the art will recognize that changes may be made in form and detail without departing from the spirit and scope of the claimed subject matter. For example, although different example embodiments may have been described as including one or more features providing one or more benefits, it is contemplated that the described features may be interchanged with one another or alternatively be combined with one another in the described example embodiments or in other alternative embodiments. Because the technology of the present disclosure is relatively complex, not all changes in the technology are foreseeable. The present disclosure described with reference to the example embodiments and set forth in the following claims is manifestly intended to be as broad as possible. For example, unless specifically otherwise noted, the claims reciting a single particular element also encompass a plurality of such particular elements.

What is claimed is:

1. A modular rack system comprising:
   a first rack module comprising:
      a bay comprising a first side wall, a second side wall and floor; and
      an intermediate wall positioning mechanism to support an intermediate wall at different spacings with respect to the first side wall, the intermediate wall positioning mechanism comprising:
         a channel along the floor;
         a wall holder to support the intermediate wall at a first spacing from the first side wall, the wall holder being removably received within the channel to allow the wall holder to be exchanged for a different wall holder supporting the intermediate wall at a second spacing from the first side wall;
      wherein the first side wall comprises a vertical panel and a flange horizontally extending from the vertical panel, the flange being configured to be adjustably positioned and retained relative to the floor to adjust a spacing between the first side wall and the second side wall.

2. The modular rack system of claim 1, wherein the intermediate wall positioning mechanism comprises a wall holder coupled to the floor to support the intermediate wall at a first spacing from the first side wall, the wall holder being removably connected to the floor to allow the wall holder to be exchanged for a different wall holder supporting the intermediate wall at a second spacing from the first side wall.

3. The modular rack system of claim 1, wherein the wall holder comprises a track to removably receive the intermediate wall.

4. The modular rack system of claim 3, wherein the wall holder comprises a second track spaced from the track to removably receive a second intermediate wall.

5. The modular rack system of claim 4, wherein the wall holder comprises a third track spaced from the track and the second track to removably receive the intermediate wall.

6. The modular rack system of claim 1, wherein the intermediate wall positioning mechanism comprises:
   a second channel along a top of the bay;
   a second wall holder to retain the intermediate wall at the first spacing from the first side wall, the second wall holder being removably received within the second channel to allow the second wall holder to be exchanged for a different second wall holder supporting the intermediate wall at the second spacing from the first side wall.

7. The modular rack system of claim 1, wherein the first side wall and the second side wall cooperate with the floor to adjustably position the first side wall and the second side wall at a selected one of a first spacing of 600 mm and a second spacing of 609 mm.

8. The modular rack system of claim 1 further comprising:
   a second rack module releasably coupled to the rack module, the second rack module comprising:
      a second bay;
      a second intermediate wall positioning mechanism to support a second intermediate wall at different spacings with respect to the first side wall.

9. The modular rack system of claim 8 further comprising:
   a utility rack module coupled vertically between the rack module and the second rack module.

10. The modular rack system of claim 9 further comprising a shared resource within the utility rack module, the shared resource selected from a group of shared resource consisting of: a power unit to supply power to devices in the rack module and the second rack module; a storage device in communication with processing units within the rack module and the second rack module; a switching device within the utility rack module for serving the rack module and the second rack module; and a liquid cooling connection in the utility rack module for liquid cooling in the rack module and the second rack module.

11. The modular rack system of claim 9 further comprising:
a third rack module comprising a bay, wherein the utility rack module extends outwardly beyond the rack module horizontally across the third rack module.

12. A modular rack system comprising:
a first rack module comprising:
   a first bay to contain a first computing device, the first bay comprising a first side wall, a second side wall and floor; and
   an intermediate wall positioning mechanism to support an intermediate wall at different spacings with respect to the first side wall, the intermediate wall positioning mechanism comprising:
      a channel along the floor;
      a wall holder to support the intermediate wall at a first spacing from the first side wall, the wall holder being removably received within the channel to allow the wall holder to be exchanged for a different wall holder supporting the intermediate wall at a second spacing from the first side wall;
   wherein the first side wall comprises a vertical panel and a flange horizontally extending from the vertical panel, the flange being configured to be adjustably positioned and retained relative to the floor to adjust a spacing between the first side wall and the second side wall; and a second rack module comprising a second bay to contain a second computing device; and
an utility rack module horizontally extending across the first rack module and the second rack module to serve the first computing device and the second computing device.

13. A method for providing a modular rack system, comprising:
removably coupling identical rack modules comprising a first rack module and a second rack module;
removably positioning, with an intermediate wall positioning mechanism, a first intermediate wall (282, 782) within the first rack module at a first spacing with respect to sides of the first rack module, wherein the intermediate wall positioning mechanism comprises:
   a channel along the floor;
   a wall holder to support the intermediate wall at a first spacing from the first side wall, the wall holder being removably received within the channel to allow the wall holder to be exchanged for a different wall holder supporting the intermediate wall at a second spacing from the first side wall; and
removably positioning a second intermediate wall within the second rack module at a second spacing, different than the first spacing, with respect to sides of the first rack module,
wherein the first side wall comprises a vertical panel and a flange horizontally extending from the vertical panel, the flange being configured to be adjustably positioned and retained relative to the floor to adjust a spacing between the first side wall and the second side wall.

\* \* \* \* \*